US012690360B2

(12) United States Patent　　　(10) Patent No.: US 12,690,360 B2
Yue et al.　　　　　　　　　　　　(45) Date of Patent: Jul. 21, 2026

(54) DISPLAY MODULE AND ELECTRONIC DEVICE

(71) Applicant: Wuhan Tianma Microelectronics Co., Ltd., Wuhan (CN)

(72) Inventors: Qin Yue, Wuhan (CN); Yangzhao Ma, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 882 days.

(21) Appl. No.: 17/981,801

(22) Filed: Nov. 7, 2022

(65) Prior Publication Data

US 2023/0056074 A1　　　Feb. 23, 2023

(30) Foreign Application Priority Data

Jun. 27, 2022　(CN) ......................... 202210744582.9

(51) Int. Cl.
　H10K 59/60　　　(2023.01)
　H10K 50/86　　　(2023.01)
　H10K 59/38　　　(2023.01)
(52) U.S. Cl.
　CPC ........... H10K 59/60 (2023.02); H10K 50/865 (2023.02); H10K 59/38 (2023.02)
(58) Field of Classification Search
　CPC ...... H10K 59/60; H10K 50/865; H10K 59/38; H10K 39/34; H10K 59/65; H10K 59/875; H10K 59/8792; H10K 59/126; H10K 50/85; H10K 50/86
See application file for complete search history.

(56) References Cited

U.S. PATENT DOCUMENTS 12,446,376　B2 *　10/2025　Zeng ..................... H10H 29/142
2016/0211311　A1 *　7/2016　Sato ........................ H10K 59/38
2018/0053032　A1 *　2/2018　Ding ...................... G06V 40/12
　　　　　　　　　　　　(Continued)

FOREIGN PATENT DOCUMENTS

CN　　　108899344 A　　11/2018
CN　　　112379794 A　　2/2021
　　　　　　　　　(Continued)

*Primary Examiner* — Yara B Green
*Assistant Examiner* — Akhee Sarker-Nag
(74) *Attorney, Agent, or Firm* — KDW Firm PLLC

(57) ABSTRACT

Disclosed are a display module and an electronic device. The display module includes a photosensitive region and a non-photosensitive region located on at least one side of the photosensitive region. The display module further includes a light-emitting element located in the photosensitive region and the non-photosensitive region, a light-shielding layer located at the photosensitive region and the non-photosensitive region and at a light-exiting side of the light-emitting element, and a light-guiding layer at least located at the photosensitive region and at a side of the light-emitting element facing away from the light-shielding layer. The light-guiding layer includes light-guiding openings, the light-shielding layer includes first light-shielding openings located in the photosensitive region and second light-shielding openings located in the non-photosensitive region, and the first light-shielding openings at least partially overlap the light-guiding openings along a thickness direction of the display module.

20 Claims, 11 Drawing Sheets

AA'

(56)                    References Cited

U.S. PATENT DOCUMENTS

| | | | | |
|---|---|---|---|---|
| 2018/0233531 | A1* | 8/2018 | Huang | H10F 39/8057 |
| 2019/0371865 | A1* | 12/2019 | Lee | H10K 59/8791 |
| 2020/0293739 | A1* | 9/2020 | Yang | H10K 59/131 |
| 2020/0403168 | A1* | 12/2020 | Li | H10K 77/10 |
| 2021/0334504 | A1* | 10/2021 | Lu | H10F 39/8053 |
| 2021/0366933 | A1* | 11/2021 | Zhang | H10F 39/80 |
| 2022/0123065 | A1* | 4/2022 | Jeong | H10K 59/352 |
| 2022/0149135 | A1* | 5/2022 | Choi | H10K 59/352 |
| 2022/0208863 | A1* | 6/2022 | Cho | H10K 59/131 |
| 2022/0302224 | A1* | 9/2022 | Wu | H10K 59/60 |
| 2022/0351540 | A1* | 11/2022 | Hai | H10K 59/124 |
| 2022/0367589 | A1* | 11/2022 | Leng | H10K 59/126 |
| 2023/0031404 | A1* | 2/2023 | Chen | H10K 59/40 |
| 2024/0049580 | A1* | 2/2024 | Zhou | H10K 59/8792 |

FOREIGN PATENT DOCUMENTS

| | | | |
|---|---|---|---|
| CN | 113078190 A | 7/2021 | |
| CN | 215834552 U | 2/2022 | |

* cited by examiner

AA'

10

10

200

420

100

410

510

100

410A1

510B/510

410B1

510A/510

510A1          410A/410

510B1          410B/410

DISPLAY MODULE AND ELECTRONIC DEVICE

CROSS-REFERENCE TO RELATED APPLICATION(S)

This application claims priority to Chinese Patent Application No. 202210744582.9 filed Jun. 27, 2022, the disclosure of which is incorporated herein by reference in its entirety.

TECHNICAL FIELD

Embodiments of the present disclosure relate to a display technology, and in particular, to a display module and an electronic device.

BACKGROUND

With the development of display technologies, a display panel has been widely applied in production and daily life. However, in the related art, there are still some technical problems to be solved in the display panel. For example, in the display panel including a photosensitive structure, usually, display defects are also introduced while ensuring that the photosensitive structure normally receives light signals, which affects the entire display effect of the display panel.

SUMMARY

The present disclosure provides a display module and an electronic device, where multiple first light-shielding openings provided in the light-shielding layer are used for ensuring light collection, and multiple second light-shielding openings also provided in the light-shielding layer are used for breaking the arrangement regularity of the openings in the light-shielding layer, thus preventing periodic dark and bright stripes in the display module, and improving the display effect of the display module.

A display module is provided in embodiments of the present disclosure. The display module includes a photosensitive region and a non-photosensitive region located on at least one side of the photosensitive region.

The display module further includes: a light-emitting element, a light-shielding layer, and a light-guiding layer. The light-emitting element is located in the photosensitive region and the non-photosensitive region. The light-shielding layer is located at the photosensitive region and the non-photosensitive region, and at a light-exiting side of the light-emitting element. The light-guiding layer is at least located at the photosensitive region and at a side of the light-emitting element facing away from the light-shielding layer.

The light-guiding layer includes multiple light-guiding openings, the light-shielding layer includes multiple first light-shielding openings and multiple second light-shielding openings, the multiple first light-shielding openings are located in the photosensitive region, the multiple second light-shielding openings are located in the non-photosensitive region, and the multiple first light-shielding openings at least partially overlap the multiple light-guiding openings along a thickness direction of the display module.

An electronic device is provided in the embodiments of the present disclosure and includes any display module described above.

DETAILED DESCRIPTION

Figure 1:
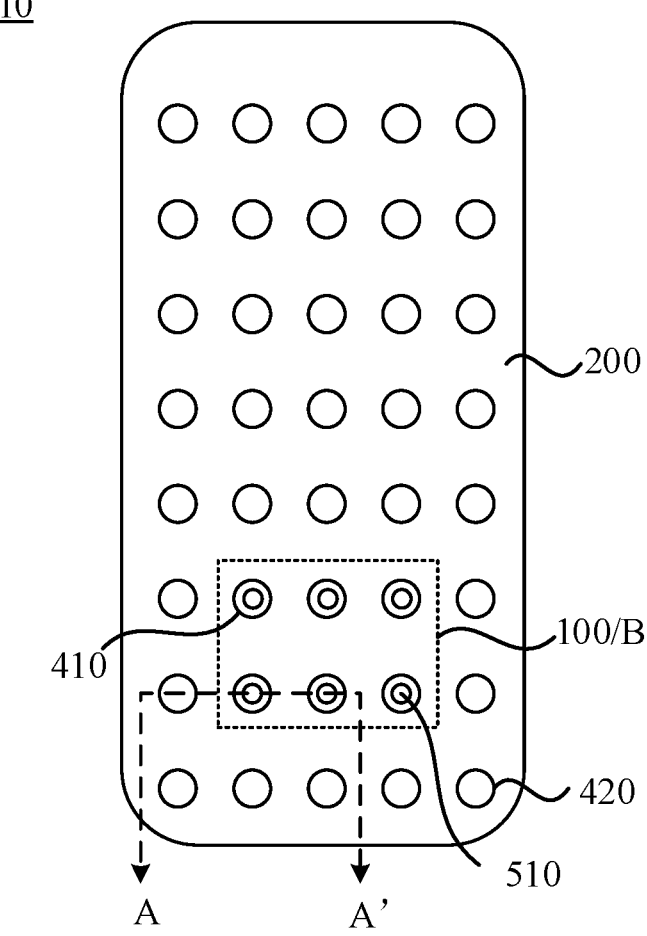
FIG. 1 is a structural diagram of a display module provided by an embodiment of the present disclosure.

Hereinafter the present disclosure is further described in detail in conjunction with the drawings and embodiments. It is to be understood that the embodiments provided below are intended to illustrate rather than to limit the present disclosure. Additionally, it is to be noted that, for ease of description, only part, not all, of structures related to the present disclosure are illustrated in the drawings.

It is obvious for those skilled in the art that various modifications and changes in the present disclosure may be made without departing from the scope of the present disclosure. Accordingly, the present disclosure is intended to cover modifications and variations of the present disclosure that fall within the scope of the corresponding claims (the claimed technical solutions) and their equivalents. It is to be noted that embodiments of the present disclosure, if not in collision, may be combined.

Figure 2:
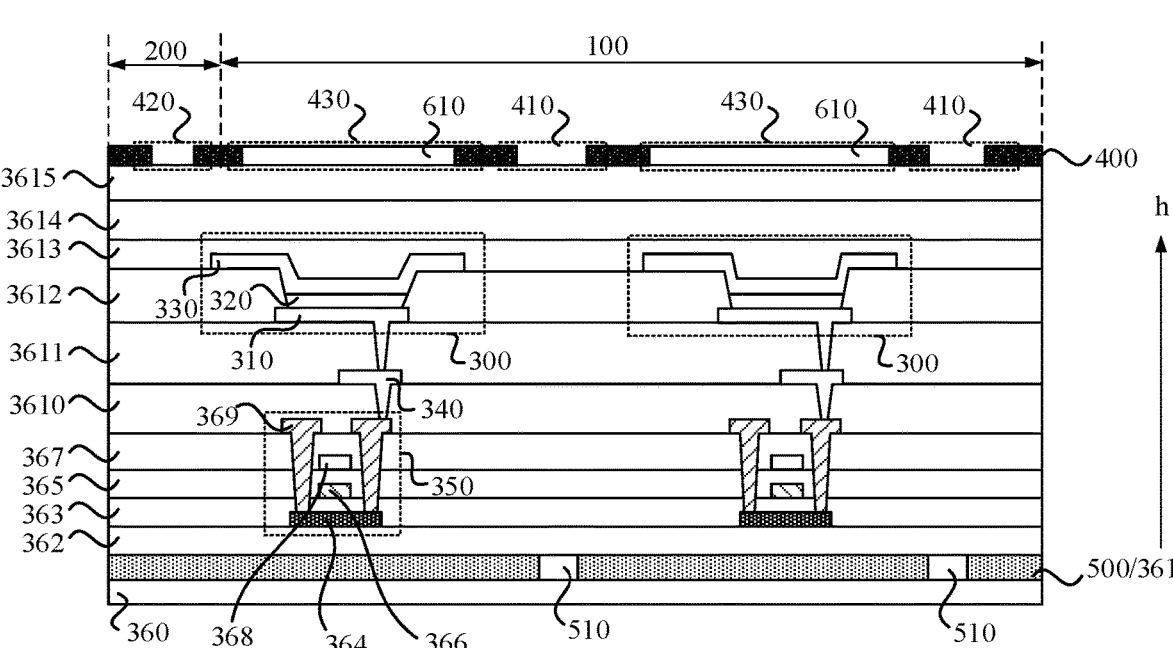
FIG. 2 is a diagram illustrating the display module shown in FIG. 1 taken along line AA'.

FIG. 1 is a structural diagram of a display module provided by an embodiment of the present disclosure, and FIG. 2 is a diagram illustrating the display module shown in FIG. 1 taken along line AA'. Referring to FIGS. 1 and 2, the display module 10 provided by embodiments of the present disclosure includes a photosensitive region 100 and a non-photosensitive region 200 located on at least one side of the photosensitive region 100. The display module 100 further includes a light-emitting element 300, a light-shielding layer 400, and a light-guiding layer 500. The light-emitting element 300 is located in the photosensitive region 100 and the non-photosensitive region 200, the light-shielding layer 400 is located at the photosensitive region 100 and the non-photosensitive region 200 and at a light-exiting side of the light-emitting element 300, and the light-guiding layer is at least located at the photosensitive region 100 and at a side of the light-emitting element 300 facing away from the light-shielding layer 400. The light-guiding layer 500 includes multiple light-guiding openings 510, the light-shielding layer 400 includes multiple first light-shielding openings 410 and multiple second light-shielding openings 420, the multiple first light-shielding openings 410 are located in the photosensitive region 100, the multiple second light-shielding openings 420 are located in the non-photosensitive region 200, and the multiple first light-shielding openings 410 at least partially overlap the multiple light-guiding openings 510 along a thickness direction h of the display module 10.

The display module 10 includes the photosensitive region 100 and the non-photosensitive region 200, where the photosensitive region 100 may acquire external light and perform optical recognition such as fingerprint recognition or perform optical imaging based on the acquired light, to ensure that the display module has an optical recognition function. The non-photosensitive region 200 is different from the photosensitive region in that the non-photosensitive region 200 may be a normal display region which does not need to acquire external light.

In some embodiments, the display module 10 further includes the light-emitting element 300, the light-shielding layer 400 and the light-guiding layer 500, where the light-shielding layer 400 is located at the light-exiting side of the light-emitting element 300, and the light-guiding layer 500 is located at the side of the light-emitting element 300 facing away from the light-shielding layer 400, that is, the light-shielding layer 400 and the light-guiding layer 500 are located at two opposite sides of the light-emitting element 300, respectively. Further, the light-shielding layer 400 includes a light-shielding distribution among different light-emitting elements 300 in the photosensitive region 100 and in the non-photosensitive region 200, and the light-shielding layer 400 is arranged to prevent crosstalk among light emitted from different light-emitting elements 300, thereby ensuring display effect of the display module in the photosensitive region 100 and the non-photosensitive region 200. The light-guiding layer 500 includes the multiple light-guiding openings 510 which are at least disposed in the photosensitive region 100, and a light-guiding opening 510 is used for guiding light into the photosensitive structure to ensure that the photosensitive structure can achieve the optical recognition based on the received light. For example, when the photosensitive structure is a fingerprint recognition structure, the multiple light-guiding openings 510 can be understood as "imaging apertures", and the fingerprint recognition structure implements fingerprint recognition based on the principle of aperture imaging. Corresponding to the multiple light-guiding openings 510 disposed in the light-guiding layer 500, the multiple first light-shielding opening 410 are provided in the light-shielding layer 400. The multiple first light-shielding openings 410 are located in the photosensitive region 100 and at least partially overlap the multiple light-guiding opening 510 in the thickness direction (the h direction as shown in the drawing) of the display module 510, that is, the light passing through the multiple first light-shielding openings 410 can be incident on the photosensitive structure again through the multiple light-guiding openings 510, thereby ensuring that the optical recognition can be normally performed on the photosensitive structure.

In some embodiments, the light-shielding layer 400 further includes the multiple second light-shielding opening 420, which are different from the multiple first light-shielding openings 410, the multiple second light-shielding openings 420 are disposed in the non-photosensitive region 420 and do not overlap the multiple light-guiding openings 510 in the light-guiding layer 500 along the thickness direction of the display module, that is, the multiple second light-shielding openings 420 are not used for acquiring the external light. Since the light emitted from the light-emitting element 300 is shielded by a region where the light-shielding layer 400 is provided in the display module 10, the entire display module is darker. The light at the first light-shielding openings 410 is relatively bright. In the related art, the first light-shielding openings 410 are regularly disposed, however fixed periodic dark and bright stripes appear in the display module. By contrast, in the embodiments of the present disclosure, the second light-shielding openings 420 are provided to break the regular arrangement of the first light-shielding openings 410, thereby avoiding the occurrence of the fixed periodic dark and bright stripes and improving the display effect of the display module 10.

Further, in the embodiments of the present disclosure, the light-shielding layer 400 is further provided with third light-shielding openings 430 which at least partially overlap the light-emitting elements 300 along the thickness direction h of the display module. The third light-shielding openings 430 are disposed to ensure that the display light in the display module 10 can be normally emitted and that the display module 10 can normally emit light and display. It is to be noted that the second light-shielding openings 420 in the light-shielding layer 400 in the embodiments of the present disclosure are light-shielding openings that are different from either the first light-shielding openings 410 or the third light-shielding openings 430, that is, the second light-shielding openings 420 are not used for transmitting light for the optical recognition or for transmitting light for the display light of the display module. The second light-shielding openings 420 are disposed to break regular arrangement of the first light-shielding openings 410, to avoid the occurrence of fixed periodic dark and bright stripes and improve the display effect of the display module 10.

Further, the display module provided in the embodiments of the present disclosure further includes color-filtering layers 610 provided in the third light-shielding openings 430, and the color-filtering layers 610 are used for performing color filtering on the light emitted from the light-emitting elements 300 to achieve the color display of the display module 10, that is, a color-filtering layer 610, only allow light with a same color emitted from a light light-emitting element 300 to pass through but absorb light with a different color. For example, a color-filtering layer 610 which is red, only allow red color emitted from the light light-emitting element 300 to pass through, but absorbs green light or blue light emitted from another light light-emitting element 300. According to the display module provided in the embodiments of the present disclosure, the light-shielding layer 400 and the color-filtering layer 610 are provided at the light-exiting side of the light-emitting element 300. By providing the light-shielding layer 400 and the color-filtering layer 610, not only the color display of the display module 10 can be ensured and the light emission crosstalk between the adjacent light-emitting elements 300 can be avoided, but also a polarizer of the display module 10 can be replaced through the light-shielding layer 400 and the color-filtering layer 610. Thus, on the one hand, the reflection of external ambient light can be reduced by providing the light-shielding layer 400 and the color-filtering layer 610, the influence of external ambient light on the light emission of the display module 10 can be reduced, and the display effect of the display module 10 can be improved. On the other hand, the light emission efficiency of the display module 10 can be improved by replacing the polarizer with the light-shielding layer 400 and the color-filtering layer 610. On still another hand, the display module 10 is bendable by replacing the polarizer with the light-shielding layer 400 and the color-filtering layer 610, which is beneficial to the implementation of a bendable display module 10.

For example, referring to FIG. 2, a thin film encapsulation layer is further included between the light-shielding layer 400 and the light-emitting elements 300 for improving the encapsulation effect of the display module 10. In some embodiments, the thin film encapsulation layer includes a first inorganic encapsulation layer 3613, a first organic encapsulation layer 3614, and a second inorganic encapsulation layer 3615, and the number of films included in the thin film encapsulation layer is not limited in the embodiments of the present disclosure. The light-shielding layer 400 and the color-filtering layer 610 may be disposed on a side of the thin film encapsulation layer facing away from the light-emitting elements to achieve a display module with a "CFOT" structure.

In some embodiments, with continued reference to FIG. 2, the display module 10 provided in the embodiments of the present disclosure further includes a substrate 360, and the film above the substrate 360 further includes a pixel driving circuit 350, and the pixel driving circuit 350 is electrically connected to the light-emitting elements 300 for driving the light-emitting elements 300 to emit light to achieve normal display of the display module 10. In some embodiments, the pixel driving circuit 350 includes an insulating layer and a metal layer that are disposed alternately. For example, a first metal layer 361, a buffer layer 362, a gate insulating layer 363, an active layer 364, an intermetallic insulating layer 365, a second metal layer 366, an interlayer insulating layer 367, a capacitance plate layer 368, a third metal layer 369, a first insulating layer 3610, a first planarization layer 3611, and a pixel defining layer 3612. Further, a thin-film transistor and a capacitance are included in the pixel driving circuit 350, and the pixel driving circuit 350 may be included in the display module. In some embodiments, how the pixel driving circuit 350 is implemented may be configured according to practical situations, which is not limited herein. In an example, the pixel driving circuit includes "7T1C", "2T1C" and the like. "T" denotes a thin film transistor and "C" denotes a capacitance. With continued reference to FIG. 2, a light-emitting element 300 includes an anode layer 310, a light-emitting layer 320, and a cathode layer 330, and the pixel driving circuit 350 is electrically connected to the light-emitting elements 300 through a fourth metal layer 340, that is, the display light emitted from the light-emitting elements 300 is driven by the pixel driving circuit 350, thus ensuring the display effect of the photosensitive region 100 and the non-photosensitive region 200.

The display module provided in the embodiments of the present disclosure includes the photosensitive region and the non-photosensitive region, and further includes light-emitting elements, the light-shielding layer, and the light-guiding layer. The light-shielding layer includes the multiple first light-shielding openings and the multiple second light-shielding openings. The light-guiding layer includes the multiple light-guiding openings, and the multiple first light-shielding openings at least partially overlap the multiple light-guiding openings to ensure the light collection of the display module. Meanwhile, the multiple second light-shielding openings are added in the light-shielding layer, the arrangement of the multiple first light-shielding openings and the multiple second light-shielding openings breaks the regularity of the opening arrangement in the light-shielding layer, avoids the occurrence of fixed periodic dark and bright stripes, and improves the display effect of the display module.

With continued reference to FIGS. 1 and 2, a first light-shielding opening 410 of the multiple first light-shielding openings 410 covers a respective one of the multiple light-guiding openings 510 along the thickness direction h of the display module 10.

In some embodiments, the first light-shielding opening 410 covers the respective light-guiding opening 510, that is, a size of each first light-shielding opening 410 is larger than that of a respective light-guiding opening 510, in other words, an opening area of each first light-shielding opening 410 is larger than that of a respective light-guiding opening 510, so that it is ensured that the first light-shielding opening 410 does not block the respective light-guiding opening 510 from acquiring external light, that is, it is ensured that optical recognition can be normally performed through the light-guiding openings 410.

With continued reference to FIGS. 1 and 2, the multiple light-guiding openings 510 are arranged in an array, the multiple first light-shielding openings 410 are arranged in an array, the multiple second light-shielding openings 420 are arranged in an array, and a distribution density of the multiple first light-shielding openings 410 is the same as a distribution density of the multiple second light-shielding openings 420.

The light-guiding openings 510 in the light-guiding layer 500 are arranged in an array to ensure that the external light to be evenly acquired by the light-guiding openings 510, for example, to ensure that the imaging has uniformity after fingerprint acquisition during the fingerprint recognition process. Further, the second light-shielding openings 420 disposed in the light-shielding layer 400 can break the regular arrangement of the first light-shielding openings 410 in the light-shielding layer 400, thereby preventing the display module 10 from having fixed periodic dark and bright stripes, and improving the display effect of the display module 10. Meanwhile, by disposing the first light-shielding opening 410 in the photosensitive region 100A and the second light-shielding openings 420 in the non-photosensitive region 200, that is, disposing an entire surface of uniform light-shielding openings on a side of a light emission surface of the display module 10, the situation that part of the display module 10 is unevenly displayed can be weakened, and the display uniformity of the entire display module 10 is improved.

For example, in a case where the fingerprint recognition process is implemented through the light-guiding openings 510, the first light-shielding openings 410 and the second light-shielding openings 420 are uniformly disposed on the front surface, so that the uneven display of the photosensitive region 100 (i.e., the fingerprint recognition region), can be weakened, and the entire display effect of the display module 10 can be improved.

Figure 3:
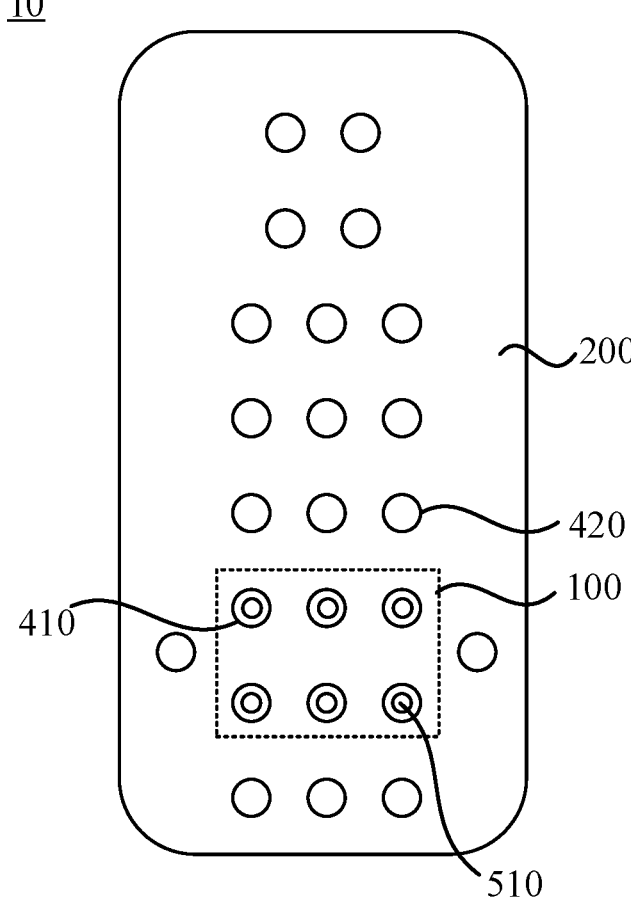
FIG. 3 is another structural diagram of a display module provided by an embodiment of the present disclosure.
Figure 4:
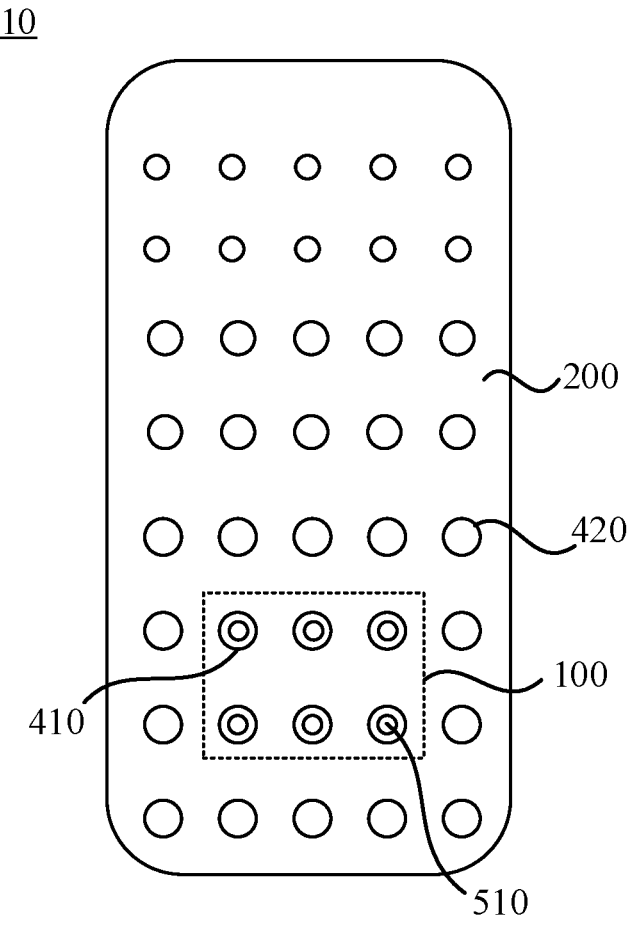
FIG. 4 is another structural diagram of a display module provided by an embodiment of the present disclosure.
Figure 5:
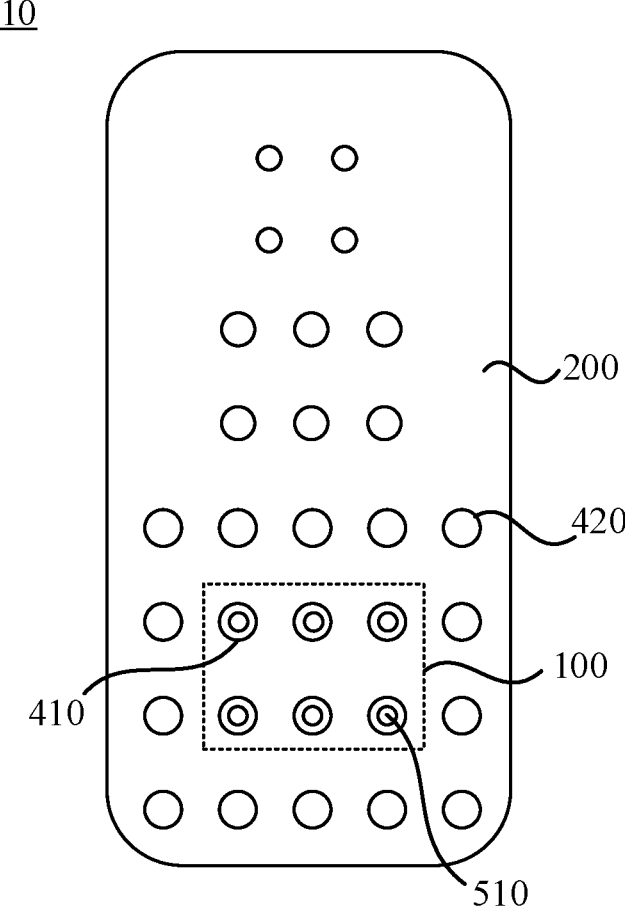
FIG. 5 is another structural diagram of a display module provided by an embodiment of the present disclosure.

FIG. 3 is another structural diagram of a display module provided by an embodiment of the present disclosure, FIG. 4 is another structural diagram of a display module provided by an embodiment of the present disclosure, and FIG. 5 is another structural diagram of a display module provided by an embodiment of the present disclosure. Referring to FIGS. 3 to 5, a sum of opening areas of second light-shielding openings 420 per unit area gradually decreases along a direction in which the photosensitive region 100 is directed toward the non-photosensitive region 200.

In some embodiments, as shown in FIGS. 3 to 5, the sum of the opening areas of the second light-shielding openings 420 per unit area which are disposed in the non-light-sensitive region 200 gradually decreases along the direction in which the photosensitive region 100 is directed toward the non-photosensitive region 200 (i.e., in an extending direction from the centered photosensitive region 100 toward the peripheral non-photosensitive region 200). That is, the sum of the opening areas of the second light-shielding openings 420 per unit area facing to a side of the photosensitive region 10 is larger than the sum of the opening areas of the second light-shielding openings 420 per unit area facing away from a side of the photosensitive region 10.

In some embodiments, the second light-shielding openings 420 break the regular arrangement of the openings in the light-shielding layer 400, thereby preventing the display module 10 from having fixed periodic dark and bright stripes, and improving the display effect of the display module 10. Meanwhile, the sum of the opening areas of the second light-shielding openings 420 per unit area gradually decreases along the direction in which the photosensitive region 100 is directed toward the non-photosensitive region 200, so that it can be ensured that the sum of the opening areas of the light-shielding openings per unit area in the light-shielding layer 400 changes gradually along the direction in which the photosensitive region 100 is directed toward the non-photosensitive region 200, so that dark and bright stripes caused by the openings in the light-shielding layer can be weakened, the phenomenon of dark and bright stripes caused by abrupt change of the sum of the opening areas of the light-shielding openings can be avoided, and the display effect of the display module 10 can be improved.

Further, in per unit area, the sum of the opening areas of the second light-shielding openings 420 may be smaller than the sum of the opening areas of the first light-shielding openings 420. In such arrangement, it can be ensured that the photosensitive region 100 receives enough light to ensure the accuracy and sensitivity of optical recognition; and, it can be ensured that the sum of the opening areas of the light-shielding openings in the non-photosensitive region 200 is smaller, so that the light entering the display module 10 through the second light-shielding openings 420 can be reduced, and thus, the light reflected by the display module 10 can be further reduced, the influence of external ambient light on the normal display light of the display module 10 can be reduced, and the display contrast of the display module 10 can be improved.

With continued reference to FIGS. 3 and 5, the distribution density of the second light-shielding openings 420 gradually decreases along the direction in which the photosensitive region 100 is directed toward the non-photosensitive region 200.

In some embodiments, when the sum of the opening areas of the second light-shielding openings 420 facing away from the first light-shielding openings 410 is smaller than the sum of the opening areas of the second light-shielding openings 420 facing to the first light-shielding openings 410, the entire display effect of the display module 10 can be improved. The display effect can be achieved by adjusting the distribution density of the second light-shielding openings 420 at different positions. Referring to FIGS. 3 to 5, the distribution density of the second light-shielding openings 420 facing to the photosensitive region 100 is larger than the distribution density of the second light-shielding openings 420 facing away from the photosensitive region 100. That is, the adjustment of the sum of the opening areas of the second light-shielding openings 420 per unit area is achieved by adjusting the distribution density of the second light-shielding openings 420, so that the dark and bright stripes caused by the openings in the light-shielding layer 400 can be weakened, the phenomenon that the dark and bright stripes are aggravated due to the abrupt change of the sum of the opening areas of the light-shielding openings can be avoided, and the display effect of the display module 10 can be improved.

It can be understood that the distribution density of the second light-shielding openings 420 gradually decreasing along the direction in which the photosensitive region 100 is directed toward the non-photosensitive region 200, may be implemented by that: as shown in FIGS. 3 to 5, along the direction in which the photosensitive region 100 is directed toward the non-photosensitive region 200, the non-photosensitive region 200 is divided into multiple sub-non-photosensitive regions, the distribution density of the second light-shielding openings 420 in different sub-non-photosensitive regions gradually decreases, and the distribution density of the second light-shielding openings 420 in the same sub-non-photosensitive region is the same. In other embodiments, the distribution density of the second light-shielding openings 420 gradually decreasing along the direction in which the photosensitive region 100 is directed toward the non-photosensitive region 200, may be implemented by that: along the direction in which the photosensitive region 100 is directed toward the non-photosensitive region 200, the non-photosensitive region 200 is divided into multiple sub-non-photosensitive regions, the distribution density of the second light-shielding openings 420 in different sub-non-photosensitive regions gradually decreases, and the distribution density of the second light-shielding openings 420 in the same sub-non-photosensitive region also decreases gradually (not shown in figure). The embodiments of the present disclosure do not limit how to achieve the gradual decrease of the distribution density of the second light-shielding openings 420 along the direction in which the photosensitive region 100 is directed toward the non-photosensitive region 200.

With continued reference to FIGS. 4 and 5, the opening areas of the second light-shielding openings 420 gradually decrease along the direction in which the photosensitive region 100 is directed toward the non-photosensitive region 200.

In some embodiments, when the sum of the opening areas of the second light-shielding openings 420 facing away from the first light-shielding openings 410 is smaller than the sum of the opening areas of the second light-shielding openings 420 facing to the first light-shielding openings 410, the entire display effect of the display module 10 can be improved. The display effect can be achieved by adjusting the opening areas of the second light-shielding openings 420 at different positions. Referring to FIGS. 4 and 5, an opening area of each second light-shielding opening 420 facing to the photosensitive region 100 is larger than an opening area of a second light-shielding opening 420 facing away from the photosensitive region 100. That is, the adjustment of the sum of the opening areas of the second light-shielding openings 420 is achieved by adjusting the opening area of the second light-shielding opening 420, so that the dark and bright stripes caused by the openings in the light-shielding layer 400 can be weakened, the phenomenon that the dark and bright stripes are aggravated due to the abrupt change of the sum of the opening areas of the light-shielding openings can be avoided, and the display effect of the display module 10 can be improved.

It can be understood that an opening area of each second light-shielding opening 420 gradually decreasing along the direction in which the photosensitive region 100 is directed toward the non-photosensitive region 200 may be implemented by that: as shown in FIGS. 4 and 5 along the direction in which the photosensitive region 100 is directed toward the non-photosensitive region 200, the non-photosensitive region 200 is divided into multiple sub-non-photosensitive regions, an opening area of each second light-shielding opening 420 in different sub-non-photosensitive regions gradually decreases, and an opening area of each second light-shielding opening 420 in the same sub-non-photosensitive region is the same. In other embodiments, an opening area of each second light-shielding opening 420 gradually decreasing along the direction in which the photosensitive region 100 directed toward the non-photosensitive region 200, may be implemented by that along the direction in which the photosensitive region 100 is directed toward the non-photosensitive region 200, the non-photosensitive region 200 includes multiple sub-non-photosensitive regions, an opening area of each second light-shielding opening 420 in different sub-non-photosensitive regions gradually decreases, and an opening area of each second light-shielding opening 420 in the same sub-non-photosensitive region also decreases gradually. The embodiments of the present disclosure do not limit how to achieve the gradual decrease of the opening area of each second light-shielding openings 420 along the direction in which the photosensitive region 100 is directed toward the non-photosensitive region 200.

Further, as shown in FIG. 5, along the direction in which the photosensitive region 100 is directed to the non-photosensitive region 200, the sum of the opening areas of the second light-shielding opening 420 gradually decreasing per unit area may be implemented by that: an opening area of a second light-shielding opening 420 facing to the photosensitive region 100 is larger than an opening area of each second light-shielding opening 420 facing away from the photosensitive region 100, meanwhile, the distribution density of the second light-shielding openings 420 facing to the photosensitive region 100 is larger than the distribution density of the second light-shielding openings 420 facing away from the photosensitive region 100. In such way, the adjustment of the sum of the opening areas of the second light-shielding openings 420 is achieved by adjusting the opening area of each second light-shielding opening 420 and the distribution density of the second light-shielding openings 420, so that the dark and bright stripes caused by the openings in the light-shielding layer 400 is weakened by the gradual change of the sum of the opening areas of the second light-shielding openings 420, the phenomenon that the dark and bright stripes are aggravated due to the abrupt change of the sum of the opening areas of the light-shielding openings can be avoided, and the display effect of the display module 10 can be improved.

The above-mentioned embodiment has described in detail the arrangement of the first light-shielding openings and the second light-shielding openings. In some embodiments, it is also possible to weaken the dark and bright stripes caused by the openings in the light-shielding layer by adjusting the arrangement of the first light-shielding openings and the light-guiding openings, which will be described in detail below.

Figure 6:
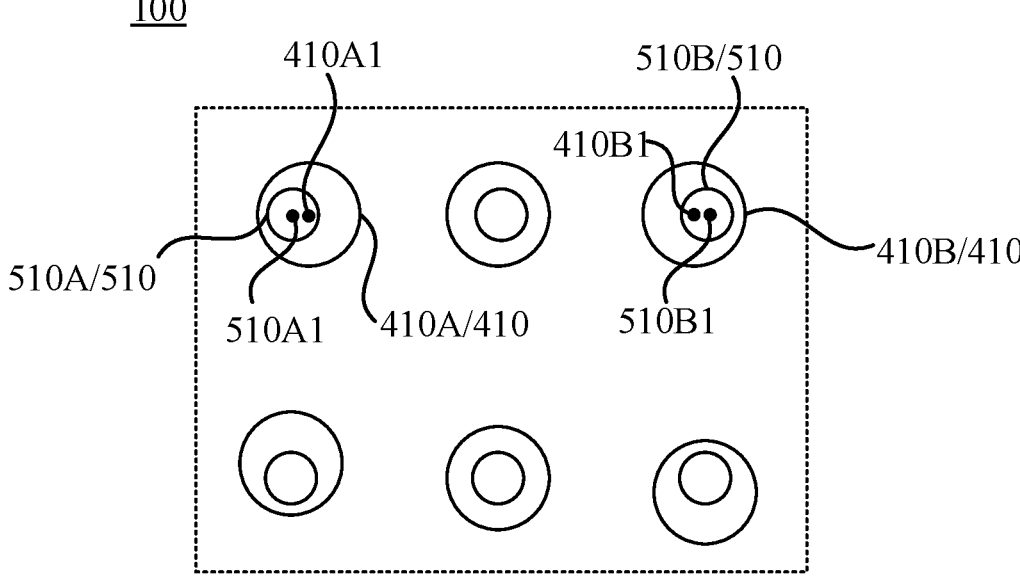
FIG. 6 is an enlarged schematic diagram of a region B in FIG. 1.

In an implementation, FIG. 6 is an enlarged schematic diagram of a region B in FIG. 1. Referring to FIGS. 1, 2 and 6, the light-guiding layer 500 includes first light-guiding openings 510A and second light-guiding openings 510B, where a first light-guiding opening 510A includes a first opening center 510A1 and a second light-guiding opening

510B includes a second opening center 510B1. The first light-shielding openings 410 includes first light-shielding sub-openings 410A and second light-shielding sub-openings 410B, where a first light-shielding sub-opening 410A includes a third opening center 410A1, and a second light-shielding sub-opening 410B includes a fourth opening center 410B1. Along the thickness direction h of the display module 10, the first light-shielding sub-opening 410A at least partially overlaps a respective first light-guiding opening 510A, and the second light-shielding sub-opening 410B at least partially overlaps a respective second light-guiding opening 510B. The first opening center 510A1 and the respective third opening center 410A1 have a first relative positional relationship, the second opening center 510B1 and the respective fourth opening center 410B1 have a second relative positional relationship, and the first relative positional relationship is different from the second relative positional relationship.

In some embodiments, the light-guiding layer 500 are provided with the first light-guiding openings 510A and the second light-guiding openings 510B. The first light-shielding openings 410 include first light-shielding sub-openings 410A and second light-shielding sub-openings 410B, the first light-shielding sub-opening 410A at least partially overlaps the respective first light-guiding opening 510A, that is, the first light-guiding opening 510A acquires external light through the first light-shielding sub-opening 410A, and the second light-shielding sub-opening 410B at least partially overlaps the respective second light-guiding opening 510B, that is, the second light-guiding opening 510B acquires external light through the second light-shielding sub-opening 410B.

Further, the first light-guiding opening 510A includes the first opening center 510A1, the second light-guiding opening 510B includes the second opening center 510B1, the first light-shielding sub-opening 410A includes the third opening center 410A1, the second light-shielding sub-opening 410B includes the fourth opening center 410B1, the first opening center 510A1 and a respective third opening center 410A1 have a first relative positional relationship, the second opening center 510B1 and a respective fourth opening center 410B1 have a second relative positional relationship, and the first relative positional relationship is different from the second relative positional relationship. The difference in relative positional relationship can be understood as a difference in the arrangement position of the first opening center 510A1 relative to the respective third opening center 410A1 and the arrangement position of the second opening center 510B1 relative to the respective fourth opening center 410B1. In an example, in FIG. 6, along the thickness direction h of the display module 10, the first opening center 510A1 is staggered from the third opening center 410A1 and disposed on a left side of the third opening center 410A1, and the second opening center 510B1 is staggered from the fourth opening center 410B1 and disposed on a right side of the fourth opening center 410B1. Since the arrangement position of the first opening center 510A1 relative to the third opening center 410A1 is different from that of the second opening center 510B1 relative to the fourth opening center 410B1, the regular arrangement of the openings in the light-shielding layer 400 and the openings in the light-guiding layer in the photosensitive region 100 is broken, so that the periodic dark and bright stripes of the display module 10 caused by the periodic openings in the light-shielding layer 400 are better weakened, and the entire display effect of the display module 10 is improved.

It is to be noted that the first opening center 510A1 being staggered from the third opening center 410A1 and disposed on the left side of the third opening center 410A1, and the second opening center 510B1 being staggered from the fourth opening center 410B1 and disposed on the right side of the fourth opening center 410B1 are only examples as shown in FIG. 6, and the present disclosure are not limited thereto. It can be understood that the relative positional relationship between the first opening center 510A1 and the third opening center 410A1, as well as the relative positional relationship between the second opening center 510B1 and the fourth opening center 410B1, may be arranged differently. For example, the first opening center 510A1 may coincides with the third opening center 410A1, while the second opening center 510B1 is staggered from the fourth opening center 410B1; or, the first opening center 510A1 may be staggered from the third opening center 410A1 and disposed on a lower side of the third opening center 410A1, while the second opening center 510B1 is staggered from the fourth opening center 410B1 and disposed on an upper side of the fourth opening center 410B1; or, the first opening center 510A1 may be staggered from the third opening center 410A1 and disposed on an upper left side of the third opening center 410A1, while the second opening center 510B1 is staggered from the fourth opening center 410B1 and disposed on an upper right side of the fourth opening center 410B1. Other like arrangements will not be described herein.

It is to be noted that the first light-guiding opening 510 A and the second light-guiding opening 510B may be any two light-guiding openings 510 in the light-guiding layer 500, and the first light-shielding sub-opening 410 A and the second light-shielding sub-opening 410B may be any two light-shielding openings in the first light-shielding openings 410, that is, the centers of any two light-guiding openings and the centers of the light-shielding sub-openings corresponding to the any two light-guiding openings have different relative positional relationships, that is, the relative positional relationships between the centers of the light-guiding openings and the centers of the light-shielding sub-openings are not the same in the photosensitive region 100, so that the periodic dark and bright stripes of the display module 10 caused by the periodic openings are sufficiently weakened, and the entire display effect of the display module 10 is improved. In other embodiments, in the photosensitive region 100, the relative positional relationships between the centers of part of the light-guiding openings and the centers of part of the light-shielding sub-openings are the same, while the relative positional relationships between the centers of part of the light-guiding openings and the centers of part of the light-shielding sub-opening are different. By the arrangements above, on the basis of ensuring that periodic dark and bright stripes of the display module 10 caused by the periodic openings in the light-shielding layer 400 can be weakened, requirements of the relative positional relationships between the centers of the light-guiding openings and the centers of the light-shielding sub-openings can be lowered, and the preparation difficulty of the display module 10 can be reduced.

Figure 7:
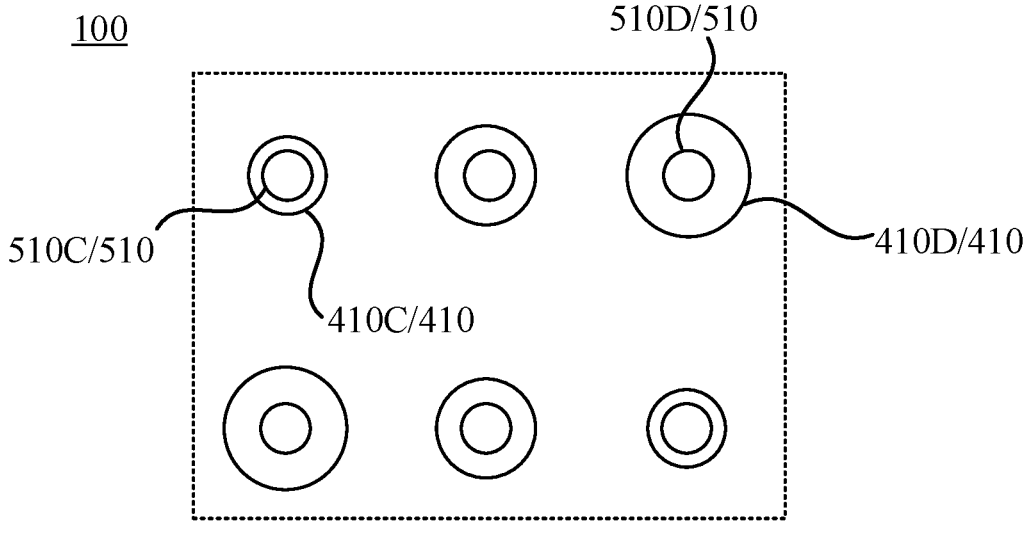
FIG. 7 is another enlarged schematic diagram of a region B in FIG. 1.
Figure 8:
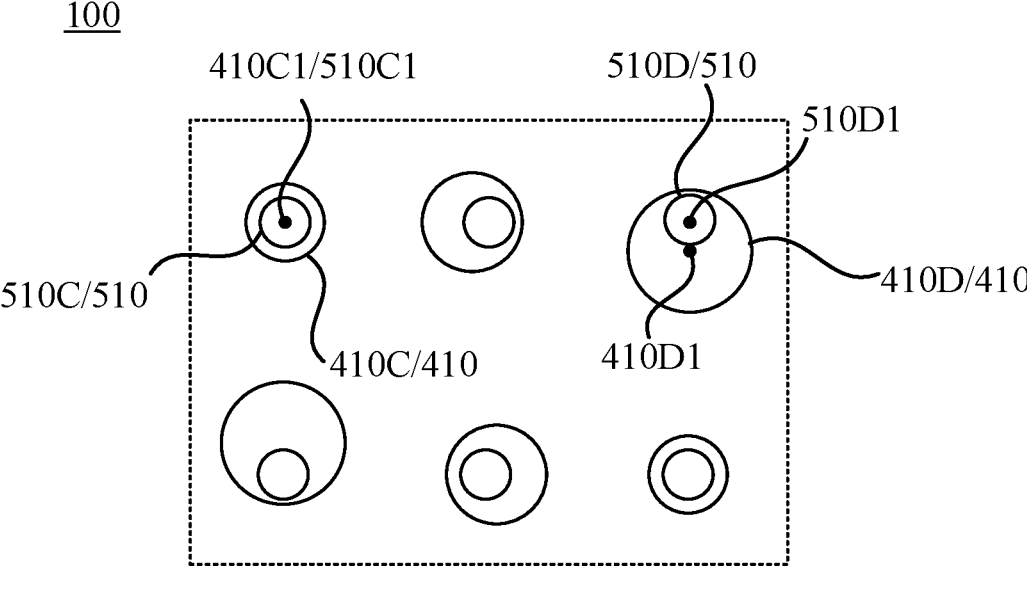
FIG. 8 is another enlarged schematic diagram of a region B in FIG. 1.

As another optional implementation, FIG. 7 is another enlarged schematic diagram of a region B in FIG. 1, and FIG. 8 is another enlarged schematic diagram of a region B in FIG. 1. Referring to FIGS. 1, 2, 7 and 8, the light-guiding layer 500 includes third light-guiding openings 510C and fourth light-guiding openings 510D. A first light-shielding opening 410 includes a third light-shielding sub-opening 410C and a fourth light-shielding sub-opening 410D, along the thickness direction h of the display module 10, the third light-shielding sub-opening 410C at least partially overlaps a respective third light-guiding opening 510C, and the fourth light-shielding sub-opening 410D at least partially overlaps a respective fourth light-guiding opening 510D; and an opening area of the third light-shielding sub-opening 410C is different from an opening area of the fourth light-shielding sub-opening 410D.

In some embodiments, the third light-shielding sub-opening 410C at least partially overlaps a respective third light-guiding opening 510C, that is, the third light-guiding opening 510C acquires external light through the respective third light-shielding sub-opening 410C; and the fourth light-shielding sub-opening 410D at least partially overlaps a respective fourth light-guiding opening 510D, that is, the fourth light-guiding opening 510D acquires external light through the respective fourth light-shielding sub-opening 410D.

Further, as shown in FIG. 7, an opening area of the third light-shielding sub-opening 410C and an opening area of the fourth light-shielding sub-opening 410D are different, that is, by adjusting an opening area of each first shielding opening 410 at different positions in the photosensitive region 100, the regularity of the openings disposed in the light-shielding layer 400 can be further broken, and the periodic dark and bright stripes of the display module 10 caused by periodic openings in the light-shielding layer 400 can be better weakened, thereby improving the entire display effect of the display module 10.

It is also to be noted that the third light-shielding sub-opening 410C and the fourth light-shielding sub-opening 410D may be any two first light-shielding openings 410, that is, any two first light-shielding openings 410 have different opening areas, so that the periodic dark and bright stripes of the display module 10 caused by periodic openings in the light-shielding layer 400 can be better weakened, thereby improving the entire display effect of the display module 10. In other embodiments, in the first light-shielding opening 410, the opening areas of part of the light-shielding sub-openings are the same, as well as the opening areas of part of the light-shielding sub-openings are different. by the above arrangements, periodic dark and bright stripes of the display module 10 caused by the periodic openings in the light-shielding layer 400 are weakened, requirements of the opening sizes of light-shielding sub-openings in the first light-shielding openings 410 can be lowered, and the preparation difficulty of the display module 10 can be reduced.

Further, referring to FIG. 8, the third light-guiding opening 510C includes a fifth opening center 510C1, the fourth light-guiding opening 510D includes a sixth opening center 510D1, the third light-shielding sub-opening 410C includes a seventh opening center 410C1, the fourth light-shielding sub-opening 410D includes an eighth opening center 410D1, the fifth opening center 510C1 and the seventh opening center 410C1 have a third relative positional relationship, the sixth opening center 510D1 and the eighth opening center 410D1 have a fourth relative positional relationship, and the third relative positional relationship is different from the fourth relative positional relationship. That is, while the opening areas of the first light-shielding openings 410 in the photosensitive region 100 are adjusted at different positions and in different sizes, the centers of the light-guiding openings and the centers of the first light-shielding openings in the photosensitive region 100 can also be disposed in a staggered manner, so that the regularity of the arrangement of openings in the light-shielding layer 400 can be further broken, and the entire display effect of the display module 10 can be improved.

Referring to FIGS. 1 to 8, the multiple light-guiding openings 510 are arranged in an array.

In some embodiments, the light-guiding openings 510 in the photosensitive region 100 are arranged in the array, so that it is possible to ensure that the light received at different regions in the photosensitive region 100 is the same, the optical recognition effect at different regions in the photo-sensitive region 100 is the same, and the balance of the optical recognition is improved. For example, the photosensitive region 100 may be a fingerprint recognition region. The light-guiding openings 510 in the fingerprint prepara-tion region are arranged in an array, so that it is possible to ensure that the fingerprint recognition effect at different regions in the fingerprint recognition region is balanced and the accuracy of the fingerprint recognition is improved.

According to the above embodiments, dark and bright stripes caused by the openings in the light-shielding layer can be weakened by adjusting the arrangement of the first light-shielding openings and the light-guiding openings, and the display effect of the display module can be improved.

Figure 9:
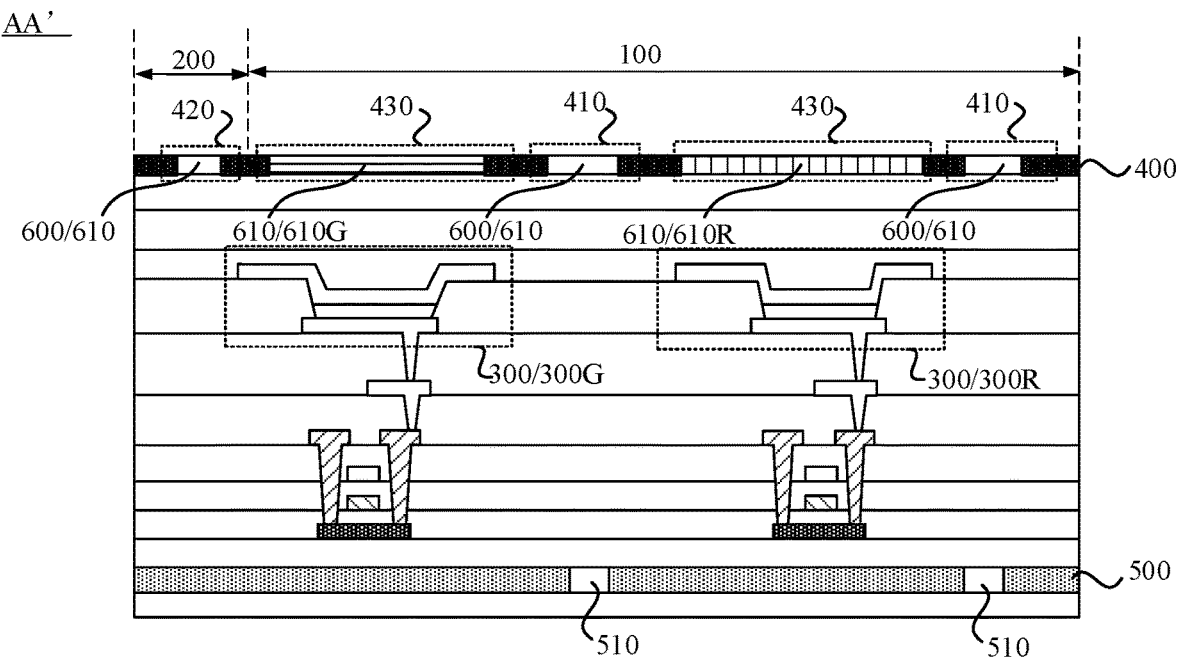
FIG. 9 is another diagram illustrating the display module shown in FIG. 1 taken along line AA'.

FIG. 9 is another diagram illustrating the display module shown in FIG. 1 taken along line AA'. Referring to FIG. 9, the display module 10 further includes a reflection adjust-ment unit 600, where the first light-shielding openings 410 are filled with the reflection adjustment unit 600 and the second light-shielding openings 420 are filled with the reflection adjustment unit 600.

In some embodiments, the second light-shielding open-ings 420 disposed in the light-shielding layer 400 can break the regular arrangement of the light-shielding openings in the light-shielding layer 400, thereby preventing the display module 10 from having fixed periodic dark and bright stripes, and improving the display effect of the display module 10. However, since multiple second light-shielding openings 420 are added on the basis of the light-shielding openings in the light-shielding layer 400, more external light will be incident into the display module 10 through the light-shielding openings in the light-shielding layer 400, and the external ambient light after being reflected by the reflective layer (e.g., a metal wire) will affect the normal display light of the display module 10 in the display module 10, causing interference to the normal display of the display module 10. Therefore, in the embodiments of the present disclosure, the first light-shielding openings 410 and the second light-shielding openings 420 in the light-shielding layer 400 are filled with the reflection adjustment unit 600, and the ambient light entering the display module 10 and the ambient light reflected to the outside by the reflection adjustment unit 600 can be adjusted by the reflection adjust-ment unit 600, thereby the interference of the external ambient light to the display can be reduced and the display effect of the display module 10 can be improved.

With continued reference to FIG. 9, the display module further includes a color-filtering layer 610 located at a light-exiting side of the light-emitting element 300, and the color-filtering layer 610 also serves as the reflection adjust-ment unit 600.

In some embodiments, the color-filtering layer 610 further includes the color-filtering layer 610. The color-filtering layer 610 may include a red color-filtering layer, a green color-filtering layer and a blue color-filtering layer, so that the color-filtering layers 610 with different colors corre-sponds to the light-emitting elements 300 with different colors. The color-filtering layer 610 includes the green color-filtering layer 610G and the red color-filtering layer 610R as example in FIG. 10. The green color-filtering layer 610G corresponds to a green light-emitting element 300G, the red color-filtering layer 610R corresponds to a red light-emitting element 300R, and the color-filtering layer 610 corresponding to the light-emitting element 300 is disposed at the third light-shielding opening 430 of the light-shielding layer 400. The light emission purity of the light-emitting element 300 can be improved by providing the color-filtering layer 610, and the external light can be further filtered, that is, the external ambient light entering the display module 10 is reduced, and the external ambient light emitted through the display module is further filtered, thereby reducing the emission of the external ambient light, and further improving the light emission effect of the display module 10.

As described above, since the color-filtering layer 610 can filter the external light and further filter the external ambient light emitted through the display module 10 to reduce the emission of the external ambient light, the color-filtering layer 610 has the same function as the reflection adjustment layer 600, so that the color-filtering layer 610 can also serves as the reflection adjustment unit 600. That is, the color-filtering layer 610 is provided at both the first light-shielding openings 410 and the second light-shielding openings 420 in the light-shielding layer 400, so that the entire display effect of the display module 10 can be improved, the preparation process of the display module 10 can be simplified, and the preparation efficiency of the display module 10 can be improved.

Figure 10:
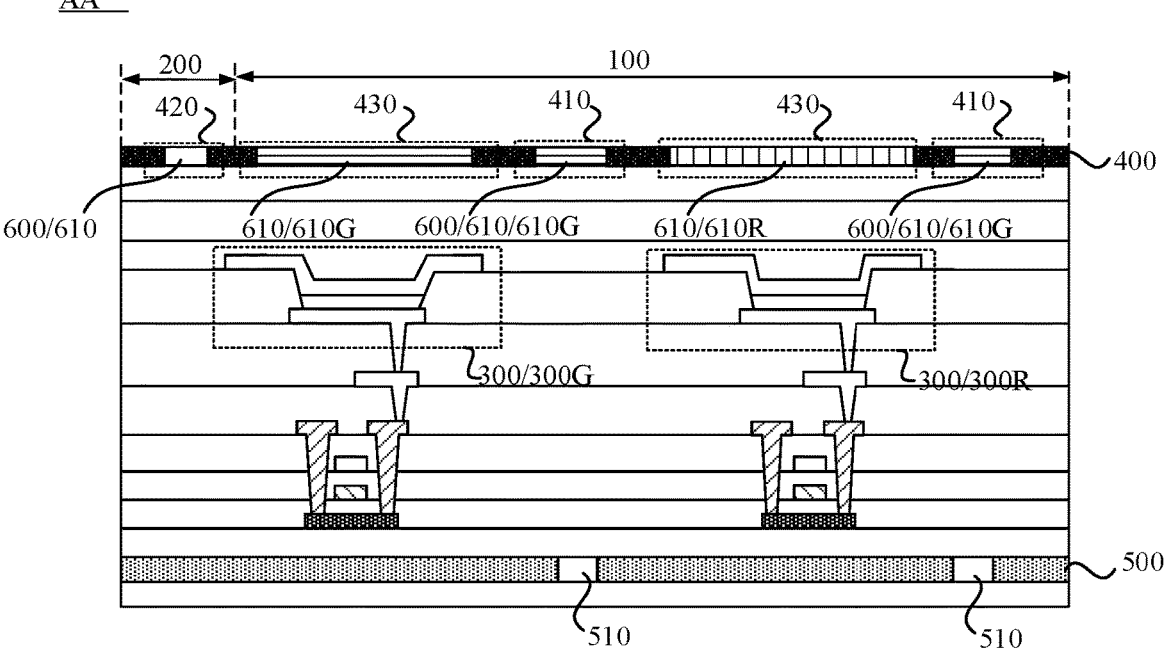
FIG. 10 is another diagram illustrating the display module shown in FIG. 1 taken along line AA'.

Further, FIG. 10 is another diagram illustrating the display module shown in FIG. 1 taken along line AA'. Referring to FIG. 10, the color-filtering layer 610 includes a green color filter 610G, and a first light-shielding opening 410 is filled with the green color-filtering layer 610G.

In some embodiments, the green light color-filtering layer 610G is filled with the first light-shielding opening 410, and the green light is incident to the photosensitive structure through the first light-shielding opening 410 and the corre-sponding light-guiding opening to ensure that the photosen-sitive structure can perform optical recognition based on the acquired green light. Since the optical recognition process is sensitive to green light, the first light-shielding opening 410 is filled with the green light color-filtering layer 610G, so that the sensitivity of the optical recognition can be improved and the accuracy of the optical recognition can be improved. For example, if the photosensitive region 100 is the fingerprint recognition region, a light-guiding opening 510 is an imaging aperture of fingerprint recognition, and a sensor (not shown in figure) of fingerprint recognition corresponding to the light-guiding opening 510 is sensitive to the green light, so that by providing that the first light-shielding opening 410 is filled with the green color-filtering layer 610G, the sensitivity and accuracy of the fingerprint recognition process can be improved.

Figure 11:
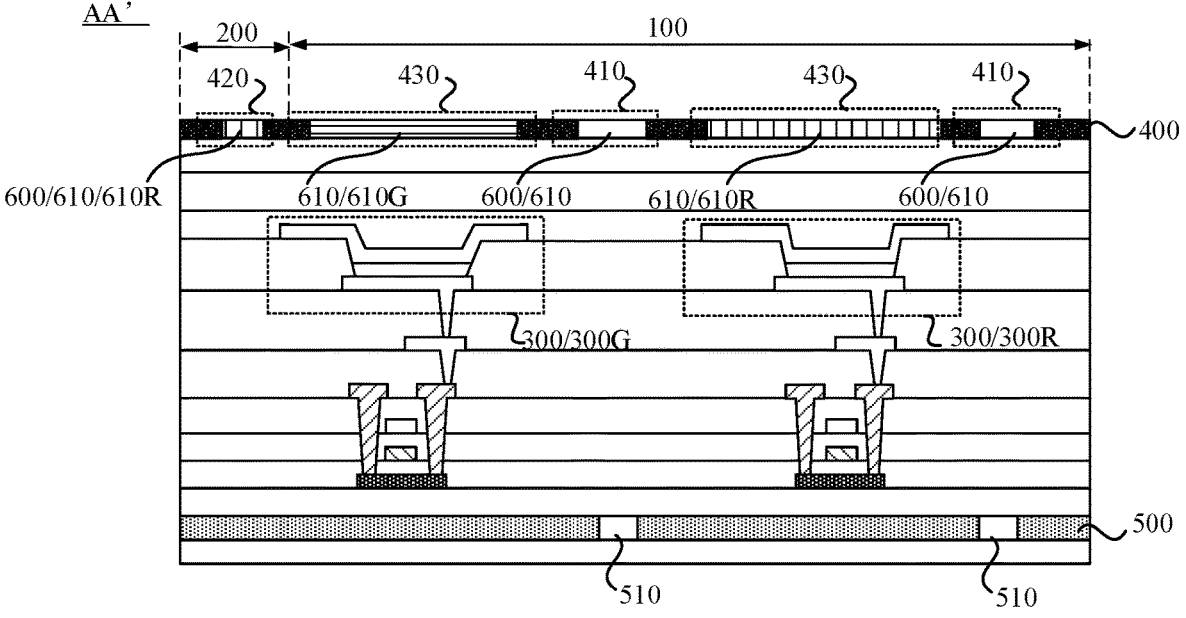
FIG. 11 is another diagram illustrating the display module shown in FIG. 1 taken along line AA'.

Further, FIG. 11 is another diagram illustrating the display module shown in FIG. 1 taken along line AA'. Referring to FIG. 11, the color-filtering layer 610 includes a red color filter 610R, and a second light-shielding opening 420 is filled with the red color-filtering layer 610R.

In some embodiments, compared with color-filtering lay-ers with other colors, the reflectance of the red color-filtering layer 610R is the lowest, and when the second light-shielding opening 420 is filled with the red color-filtering layer 610R, the reflectance of the external ambient light at the red color-filtering layer 610R can be reduced, the interference caused by the external ambient light to the display module 10 can be reduced, and the display effect can be improved.

Figure 12:
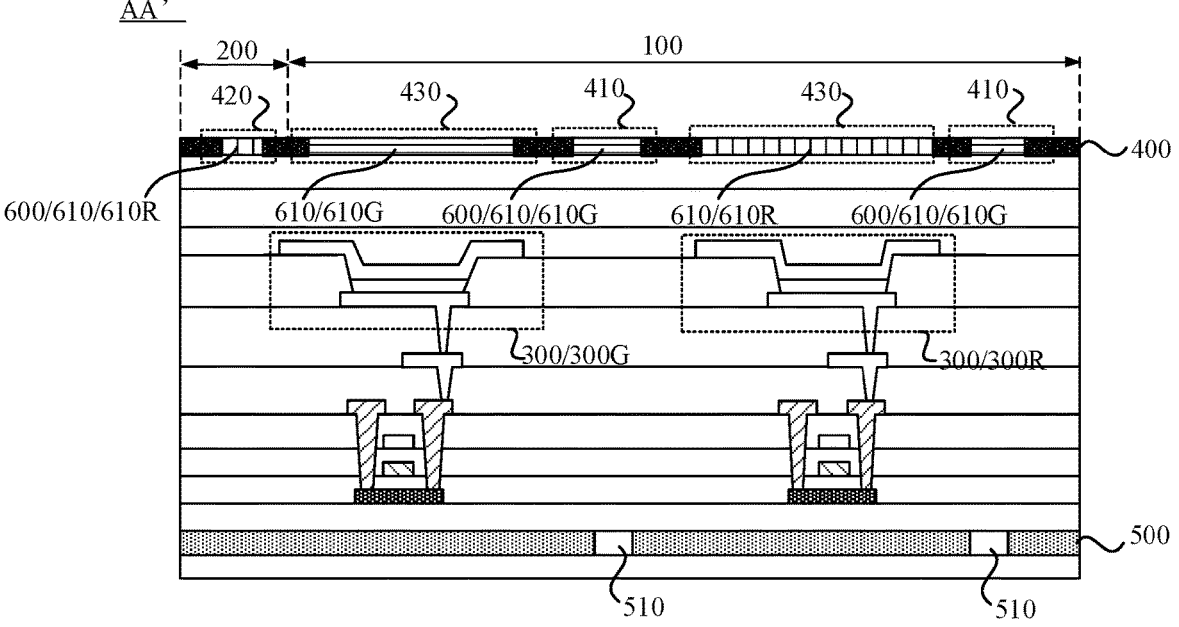
FIG. 12 is another diagram illustrating the display module shown in FIG. 1 taken along line AA'.

Further, FIG. 12 is another diagram illustrating the display module shown in FIG. 1 taken along line AA'. Referring to FIG. 12, a first light-shielding opening 410 may further be filled with the green color-filtering layer 610 G and a second light-shielding opening 420 may be filled with the red color-filtering layer 610R, so that advantages of the green color-filtering layer 610 G and the red color-filtering layer 610R can be combined. In such way, not only the sensitivity of the optical recognition may be improved and the accuracy of the optical recognition can be improved, but also the reflectance of the external ambient light at the red color-filtering layer 610R can be reduced, the interference caused by the external ambient light to the display module 10 can be reduced, and the display effect can be improved.

Figure 13:
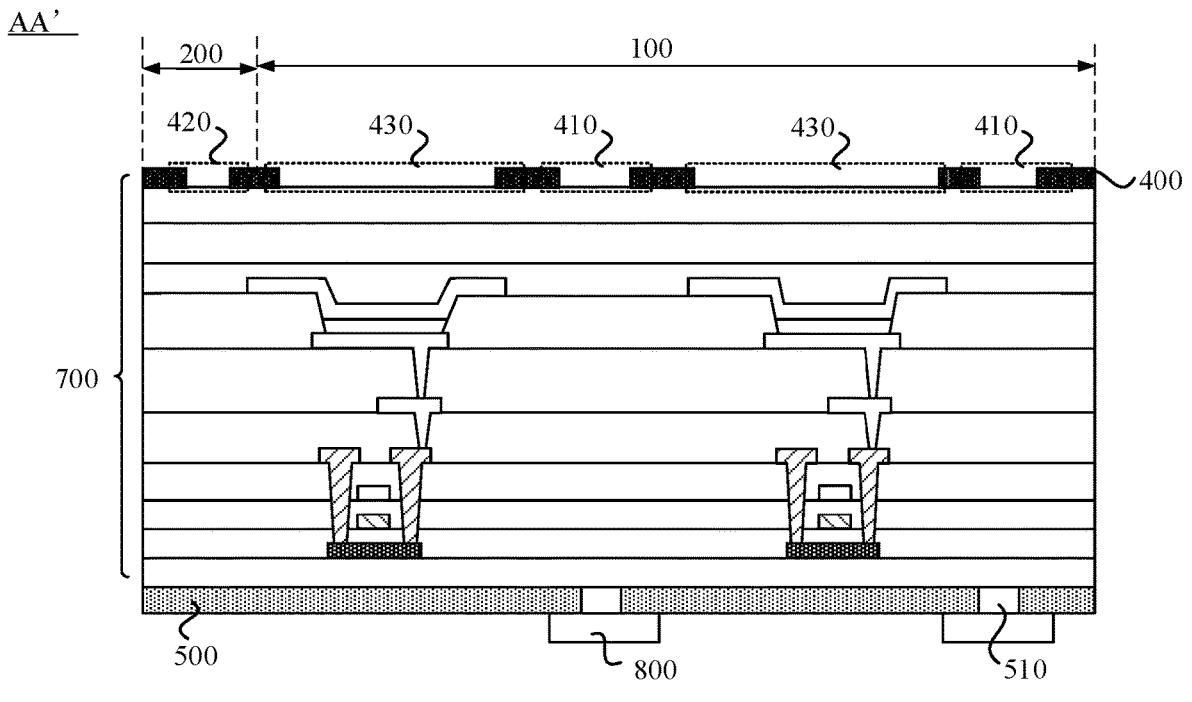
FIG. 13 is another diagram illustrating the display module shown in FIG. 1 taken along line AA'.
Figure 14:
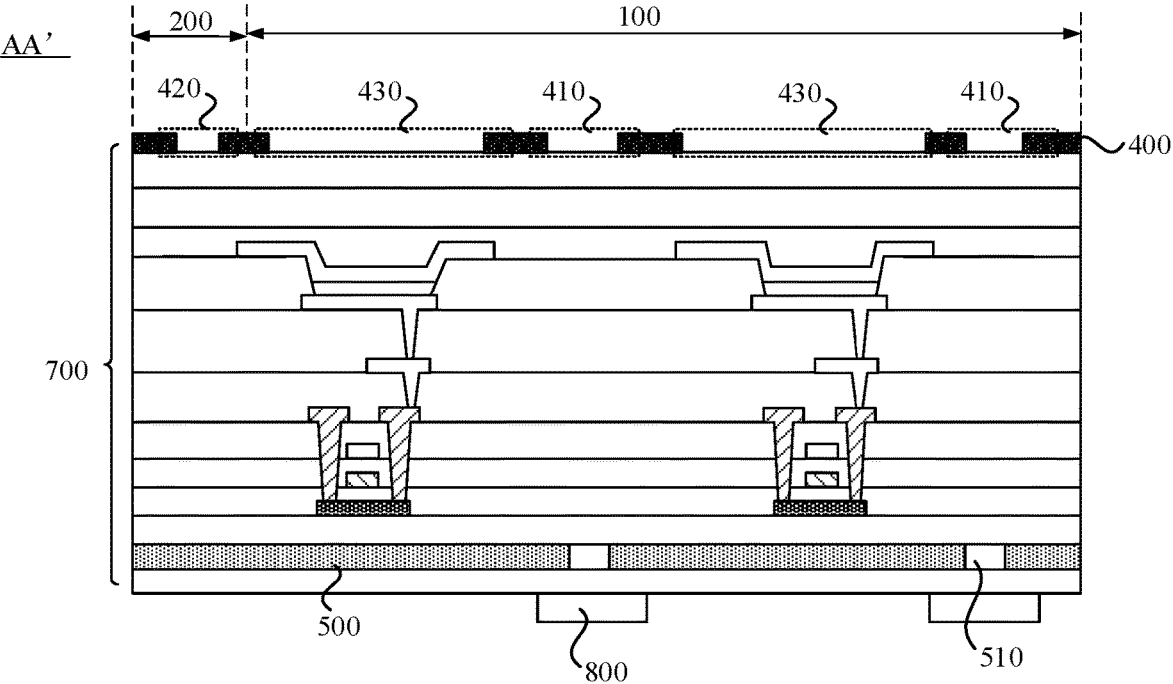
FIG. 14 is another diagram illustrating the display module shown in FIG. 1 taken along line AA'.
Figure 15:
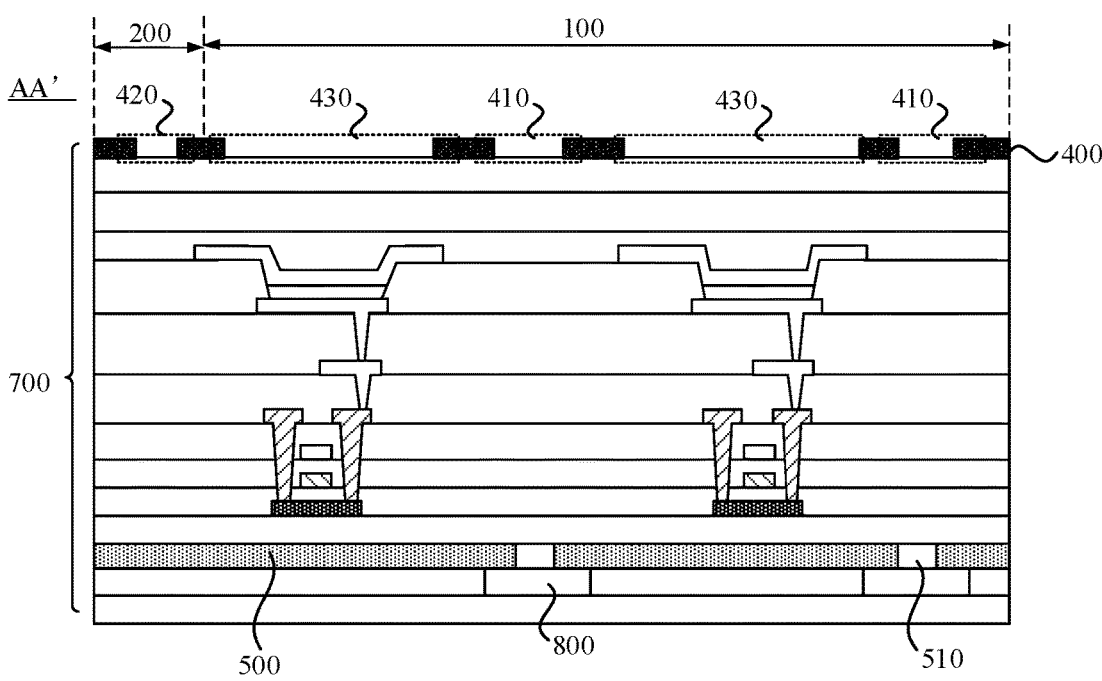
FIG. 15 is another diagram illustrating the display module shown in FIG. 1 taken along line AA'.

FIG. 13 is another diagram illustrating the display module shown in FIG. 1 taken along line AA', FIG. 14 is another diagram illustrating the display module shown in FIG. 1 taken along line AA' and FIG. 15 is another diagram illustrating the display module shown in FIG. 1 taken along line AA'. Referring to FIGS. 13 to 14, the display module 10 further includes a display panel 700 and a photosensitive layer 800, where the photosensitive layer 800 is disposed at a non-light-exiting side of the display panel 700, and the light-guiding layer 500 is disposed between the photosensitive layer 800 and the display panel 700; or the photosensitive layer 800 is disposed at a non-light-exiting side of the display panel 700, and the light-guiding layer 500 is disposed in the display panel 700; or the photosensitive layer 800 and the light-guiding layer 500 are both disposed in the display panel 700.

The display module 10 includes the display panel 700 and the photosensitive layer 800, where the display panel 700 includes a substrate 360 and film structures described above, which is not limited in the embodiments of the present disclosure. The photosensitive layer 800 may be an optical recognition structure that acquires light. For example, the photosensitive region 100 of the display module 10 is a fingerprint recognition region, and the photosensitive layer 800 may be multiple fingerprint recognition units for performing fingerprint recognition according to the light transmitted from the light-guiding opening 510, which is not limited in the embodiments of the present disclosure.

Further, the photosensitive layer 800 and the display panel 700 may be arranged in various manners. For example, referring to FIG. 13, the photosensitive layer 800 and the light-guiding layer 500 are disposed on the non-light-exiting side of the display panel 700, i.e., on the outside of the display panel 700, and the light-guiding layer 500 is disposed between the photosensitive layer 800 and the display panel 700, so that the display panel 700, the light-guiding layer 500 and the photosensitive layer 800 are disposed independently. The display panel 700, the light-guiding layer 500 and the photosensitive layer 800 may be arranged and adjusted with high flexibility. Referring to FIG. 14, the photosensitive layer 800 is disposed outside the display panel, and the light-guiding layer 500 is disposed inside the display panel 700, so that the light-guiding layer 500 can also serves as certain films in the display panel 700, and the arrangement of the light-guiding layer 500 is simple. Moreover, the display panel 700 and the photosensitive layer 800 are provided independently, and the display panel 700 and the photosensitive layer 800 can be arranged and adjusted with high flexibility. Referring to FIG. 15, the photosensitive layer 800 and the light-guiding layer 500 are disposed inside the display panel 700, so that the light-guiding layer 500 can also serve as certain films in the display panel 700, and the arrangement of the light-guiding layer 500 is simple. Meanwhile, the display module 10 can be integrated better, which is beneficial to achieve the thin design of the display module 10.

It is to be noted that, in the embodiments of the present disclosure, the specific arrangement position of the light-guiding layer and the specific arrangement position of the photosensitive layer are not limited, that is, the arrangement position of the light-guiding layer and the arrangement position of the photosensitive layer can be flexibly adjusted according to actual requirements to satisfy various use requirements.

Figure 16:
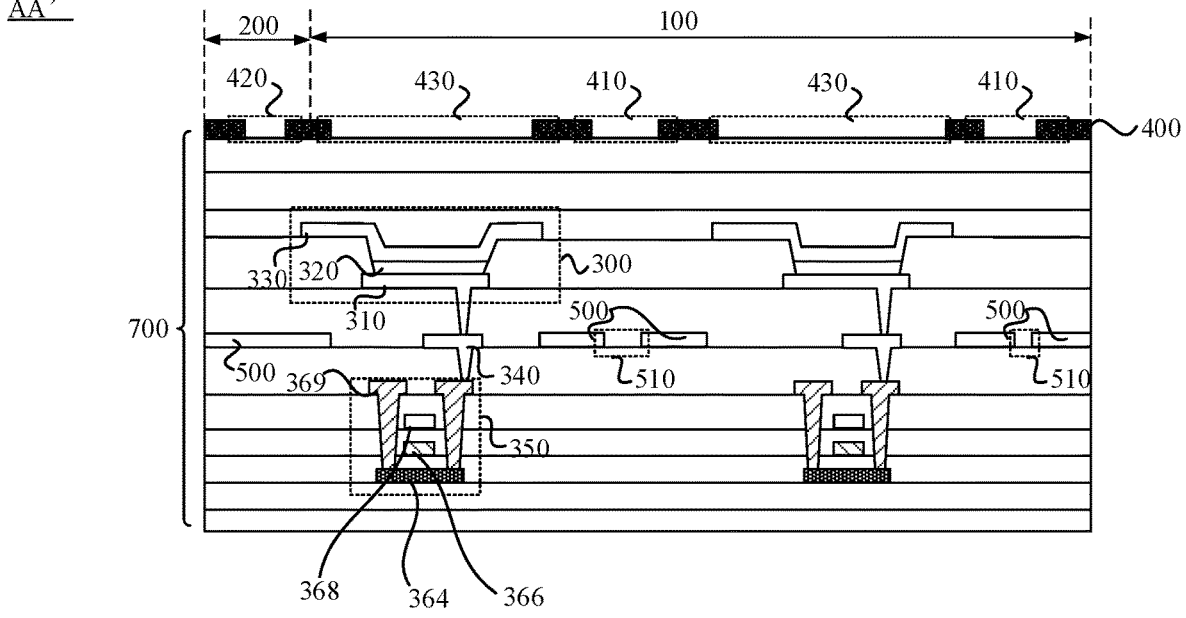
FIG. 16 is another diagram illustrating the display module shown in FIG. 1 taken along line AA'.

FIG. 16 is another diagram illustrating the display module shown in FIG. 1 taken along line AA'. Referring to FIGS. 2 and 6, the light-guiding layer 500 is disposed in the display panel 700, the display panel 700 includes a substrate 360 and a first metal layer 361, a second metal layer 366, a capacitance plate layer 368, a third metal layer 369 and a fourth metal layer 340 which are sequentially located at a same side of the substrate 360, and the first metal layer 361, the second metal layer 366, the capacitance plate layer 368, the third metal layer 369, or the fourth metal layer 340 also serves as the light-guiding layer 500.

In some embodiments, the position of the light-guiding layer 500 is not fixed and may be disposed in different films, for example, the first metal layer 361, the second metal layer 366, the capacitance plate layer 368, the third metal layer 369 or the fourth metal layer 340 in display panel 700 may also serve as the light-guiding layer 500, which may be disposed according to actual requirements. By arranging that a metal layer on one side of the display panel 700 also servers as the light-guiding layer 500, and the light-guiding openings in the light-guiding layer 500 can be prepared during the patterning process of this metal layer, so that the light-guiding layer and the optical guide opening can be simply implemented, and film structures of the display module 10 are simple, which is beneficial to achieving the thin design of the display module 10.

For example, with continued reference to FIG. 2, the first metal layer 361 in the display panel 700 also serves as the light-guiding layer 500. The first metal layer 361 may be a metal layer between a film where the pixel driving circuit 350 in the display panel is located and a film where the substrate 360 is located, and the first metal layer may block external ambient light from being incident on the pixel driving circuit 350, i.e., from being incident on a channel of an active layer 364, thereby preventing a light leakage current from being generated in the channel due to illumination, and ensuring that the normal display of the display panel is free from interference. For example, with continued reference to FIG. 16, the fourth metal layer 340 in the display panel 700 also serves as the light-guiding layer 500. The fourth metal layer 340 may be a metal layer between a film where the pixel driving circuit 350 is located and a film where the light-emitting element is located, and the fourth metal layer may serve as a bridging layer between the pixel driving circuit 350 and the light-emitting element 300, so that the deep punching can be avoided when the light-emitting element 300 is electrically connected to the pixel driving circuit 350, thus ensuring that the electrical connection between the light-emitting element 300 and the pixel driving circuit 350 is simple.

Figure 17:
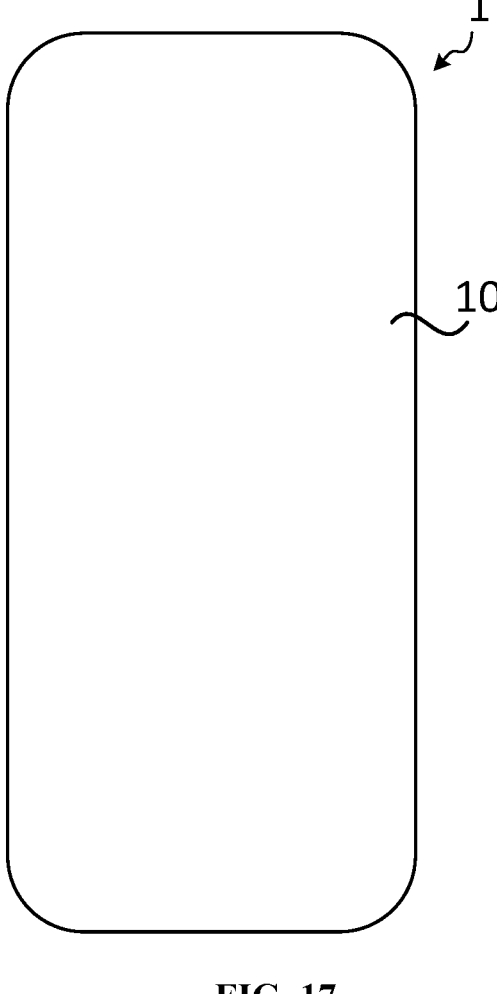
FIG. 17 is a structural diagram of an electronic device provided by an embodiment of the present disclosure.

Embodiments of the present disclosure also provide an electronic device. FIG. 17 is a structural diagram of an electronic device provided by an embodiment of the present disclosure. As shown in FIG. 17, the electronic device 1 includes the display module 10 described in any embodiment of the present disclosure. Therefore, the electronic device 1 provided by the embodiment of the present disclosure has the technical effects as any one of the embodiments described above. The explanation of same or corresponding structures or terms as those in the preceding embodiments will not be repeated herein.

The electronic device 1 provided in the embodiment of the present disclosure may be the phone shown in FIG. 17, or may be any electronic product with the display function, including but not limited to the following categories: a television, a laptop, a desktop display, a tablet computer, a digital camera, a smart bracelet, smart glasses, a vehicle-mounted display, a medical device, an industrial control device, a touch interactive terminal, and the like, which are not limited in the embodiments of the present disclosure.

What is claimed is:

1. A display module, comprising a photosensitive region and a non-photosensitive region located on at least one side of the photosensitive region;

wherein the display module further comprises:

a light-emitting element, which is located in the photosensitive region and the non-photosensitive region;

a light-shielding layer, which is located at the photosensitive region and the non-photosensitive region, and is located at a light-exiting side of the light-emitting element; and a light-guiding layer, which is at least located at the photosensitive region and is located at a side of the light-emitting element facing away from the light-shielding layer; and wherein the light-guiding layer comprises a plurality of light-guiding openings, the light-shielding layer comprises a plurality of first light-shielding openings, a plurality of second light-shielding openings and a plurality of third light-shielding openings, the plurality of first light-shielding openings are located in the photosensitive region, the plurality of second light-shielding openings are located in the non-photosensitive region, the plurality of first light-shielding openings at least partially overlap the plurality of light-guiding openings along a thickness direction of the display module, the plurality of second light-shielding openings do not overlap the light-emitting element, the plurality of third light-shielding openings at least partially overlap the light-emitting element, and a position of the second light-shielding openings is different from a position of the first light-shielding openings and a position of the third light-shielding openings.

2. The display module of claim 1, wherein the plurality of light-guiding openings are arranged in an array;

the plurality of first light-shielding openings are arranged in an array, the plurality of second light-shielding openings are arranged in an array, and a distribution density of the plurality of first light-shielding openings is same as a distribution density of the plurality of second light-shielding openings.

3. The display module of claim 1, wherein a sum of opening areas of second light-shielding openings per unit area of the plurality of second light-shielding openings gradually decreases along a direction in which the photosensitive region is directed toward the non-photosensitive region.

4. The display module of claim 3, wherein a distribution density of the plurality of second light-shielding openings gradually decreases along the direction in which the photosensitive region is directed toward the non-photosensitive region.

5. The display module of claim 3, wherein an opening area of a second light-shielding opening of the plurality of second light-shielding openings gradually decreases along the direction in which the photosensitive region is directed toward the non-photosensitive region.

6. The display module of claim 1, wherein the plurality of light-guiding openings comprises first light-guiding openings and second light-guiding openings, a first light-guiding opening of the first light-guiding openings comprises a first opening center, and a second light-guiding opening of the second light-guiding opening comprises a second opening center;

the plurality of first light-shielding openings comprise first light-shielding sub-openings and second light-shielding sub-openings, a first light-shielding sub-opening of the first light-shielding sub-opening comprises a third opening center, a second light-shielding sub-opening of the second light-shielding sub-opening comprises a fourth opening center, the first light-shielding sub-opening at least partially overlaps a respective first light-guiding opening along the thickness direction of the display module, and the second light-shielding sub-opening at least partially overlaps a respective second light-guiding opening along the thickness direction of the display module; and the first opening center and a respective third opening center have a first relative positional relationship, the second opening center and a respective fourth opening center have a second relative positional relationship, and the first relative positional relationship is different from the second relative positional relationship.

7. The display module of claim 1, wherein the plurality of light-guiding openings comprises third light-guiding openings and fourth light-guiding openings;

the plurality of first light-shielding openings comprise third light-shielding sub-openings and fourth light-shielding sub-openings, a third light-shielding sub-opening of the third light-shielding sub-openings at least partially overlaps a respective third light-guiding opening along the thickness direction of the display module, and a fourth light-shielding sub-opening of the fourth light-shielding sub-openings at least partially overlaps a respective fourth light-guiding opening along the thickness direction of the display module; and an opening area of the third light-shielding sub-opening is different from that of the fourth light-shielding sub-opening.

8. The display module of claim 1, wherein the plurality of light-guiding openings are arranged in an array.

9. The display module of claim 1, further comprising: a reflection adjustment unit, wherein a first light-shielding opening of the plurality of first light-shielding openings is filled with the reflection adjustment unit and a second light-shielding opening of the plurality of second light-shielding openings is filled with the reflection adjustment unit.

10. The display module of claim 9, further comprising a color-filtering layer located at the light-exiting side of the light-emitting element, wherein the reflection adjustment unit is also served as the color-filtering layer.

11. The display module of claim 10, wherein the color-filtering layer comprises a green color-filtering layer; and a first light-shielding opening of the plurality of first light-shielding openings is filled with the green color-filtering layer.

12. The display module of claim 10, wherein the color-filtering layer comprises a red color-filtering layer; and a second light-shielding opening of the plurality of second light-shielding openings is filled with the red color-filtering layer.

13. The display module of claim 1, further comprising: a display panel and a photosensitive layer, wherein the photosensitive layer is disposed at a non-light-exiting side of the display panel, and the light-guiding layer is disposed between the photosensitive layer and the display panel; or the photosensitive layer is disposed at a non-light-exiting side of the display panel, and the light-guiding layer is disposed in the display panel; or the photosensitive layer and the light-guiding layer are both disposed in the display panel.

14. The display module of claim 13, wherein in a case that the light-guiding layer is disposed in the display panel;

the display panel comprises a substrate and a first metal layer, a second metal layer, a capacitance plate layer, a third metal layer and a fourth metal layer which are sequentially located at a same side of the substrate; and the first metal layer, the second metal layer, the capacitance plate layer, the third metal layer, or the fourth metal layer is also served as the light-guiding layer.

15. The display module of claim 1, wherein a first light-shielding opening of the plurality of first light-shielding openings covers a respective light-guiding opening the plurality of light-guiding openings along the thickness direction of the display module.

16. An electronic device, comprising a display module, wherein the display module comprises:

a photosensitive region and a non-photosensitive region located on at least one side of the photosensitive region; wherein the display module further comprises:

a light-emitting element, which is located in the photosensitive region and the non-photosensitive region;

a light-shielding layer, which is located at the photosensitive region and the non-photosensitive region, and is located at a light-exiting side of the light-emitting element; and a light-guiding layer, which is at least located at the photosensitive region and is located at a side of the light-emitting element facing away from the light-shielding layer; and wherein the light-guiding layer comprises a plurality of light-guiding openings, the light-shielding layer comprises a plurality of first light-shielding openings, a plurality of second light-shielding openings and a plurality of third light-shielding openings, the plurality of first light-shielding openings are located in the photosensitive region, the plurality of second light-shielding openings are located in the non-photosensitive region, the plurality of first light-shielding openings at least partially overlap the plurality of light-guiding openings along a thickness direction of the display module, the plurality of second light-shielding openings do not overlap the light-emitting element, the plurality of third light-shielding openings at least partially overlap the light-emitting element, and a position of the second light-shielding openings is different from a position of the first light-shielding openings and a position of the third light-shielding openings.

17. The electronic device of claim 16, wherein the plurality of light-guiding openings are arranged in an array;

the plurality of first light-shielding openings are arranged in an array, the plurality of second light-shielding openings are arranged in an array, and a distribution density of the plurality of first light-shielding openings is same as a distribution density of the plurality of second light-shielding openings.

18. The electronic device of claim 16, wherein a sum of opening areas of second light-shielding openings per unit area of the plurality of second light-shielding openings gradually decreases along a direction in which the photosensitive region is directed toward the non-photosensitive region.

19. The electronic device of claim 18, wherein a distribution density of the plurality of second light-shielding openings gradually decreases along the direction in which the photosensitive region is directed toward the non-photosensitive region.

20. The electronic device of claim 18, wherein an opening area of a second light-shielding opening of the plurality of second light-shielding openings gradually decreases along the direction in which the photosensitive region is directed toward the non-photosensitive region.

* * * * *